(12) United States Patent
Huang

(10) Patent No.: US 8,648,261 B2
(45) Date of Patent: Feb. 11, 2014

(54) PRINTED CIRCUIT BOARD

(75) Inventor: Feng-Yan Huang, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 330 days.

(21) Appl. No.: 13/117,159

(22) Filed: May 27, 2011

(65) Prior Publication Data

US 2012/0048603 A1 Mar. 1, 2012

(30) Foreign Application Priority Data

Aug. 30, 2010 (CN) .......................... 2010 1 0266826

(51) Int. Cl.
*H05K 1/02* (2006.01)
(52) U.S. Cl.
USPC ............. 174/259; 174/254; 174/257; 29/846; 428/343; 438/106; 257/738
(58) Field of Classification Search
USPC ............. 174/259, 254, 257; 29/846; 428/343; 438/106; 257/738
See application file for complete search history.

(56) References Cited

U.S. PATENT DOCUMENTS 7,009,297 B1 * 3/2006 Chiang et al. ................. 257/738
7,264,991 B1 * 9/2007 Lin ............................... 438/106

FOREIGN PATENT DOCUMENTS

| CN | 102026529 A | | 4/2011 | |
|---|---|---|---|---|
| JP | 2011066329 | * | 3/2011 | .................... 174/259 |
| TW | 201212744 | * | 3/2012 | .................... 174/259 |

* cited by examiner

*Primary Examiner* — Xiaoliang Chen
(74) *Attorney, Agent, or Firm* — Altis Law Group, Inc.

(57) ABSTRACT

A printed circuit board comprises a circuit substrate, an electrically conductive cloth structure, and a shielding structure. The circuit substrate comprises a base layer, a grounded circuit layer, and a connecting pad formed on the grounded circuit layer. The cloth structure comprises an anisotropic conductive adhesive connected to the connecting pad, an insulating layer, and a metallic deposition layer arranged between the anisotropic conductive adhesive and the insulating layer. The shielding structure comprises a shielding metal layer, an adhesive matrix, and a number of electrically conductive particles electrically connected to the shielding metal layer. The insulating layer defines a number of through holes corresponding to the particles, the particles is arranged in the through holes respectively and electrically connected the metallic deposition layer and the shielding metal layer. A method for manufacturing the above PCB is also provided.

5 Claims, 12 Drawing Sheets

PRINTED CIRCUIT BOARD

BACKGROUND

1. Technical Field

The present disclosure generally relates to printed circuit boards (PCBs) and particularly, relates to a printed circuit board having shielding structure and a method for manufacturing the same.

2. Description of Related Art

PCBs are widely used in most electronic devices for mounting electronic components and providing electrical transmission. In some conditions, a shielding structure is needed on a surface of a PCB to provide protection against electromagnetic interference (EMI) generated by peripheral electronic components or devices.

The PCB usually comprises a grounded circuit layer and a protective layer formed on a surface of the grounded circuit layer. The grounded circuit layer comprises a connecting pad. The protective layer defines an opening and the connecting pad is exposed in the opening. One kind of well-known shielding structure includes an anisotropic conductive adhesive filled in the opening, a metallic deposition layer formed on the adhesive, an insulating layer, and a release film. The static electricity existing in the PCB can be guided to the metallic deposition layer and eliminated. The metallic deposition layer can also shield against EMI. Another kind of well-known shielding structure includes an electrically conductive adhesive filled in the opening and solder covering the adhesive. The adhesive can be silver glue. The static electricity existing in the PCB can be guided to the adhesive and eliminated.

However, demand for smaller PCB is growing, and so connecting pads are becoming smaller and smaller, and shielding structures are also becoming smaller and smaller. Thus, the amount of anisotropic conductive adhesive or electrically conductive adhesive that can be used has become so little reducing effectiveness.

What is needed, therefore, is a PCB and a method for manufacturing the same to overcome the above-described problems.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION

Embodiments will now be described in detail below and with reference to the drawings.

Figure 1:
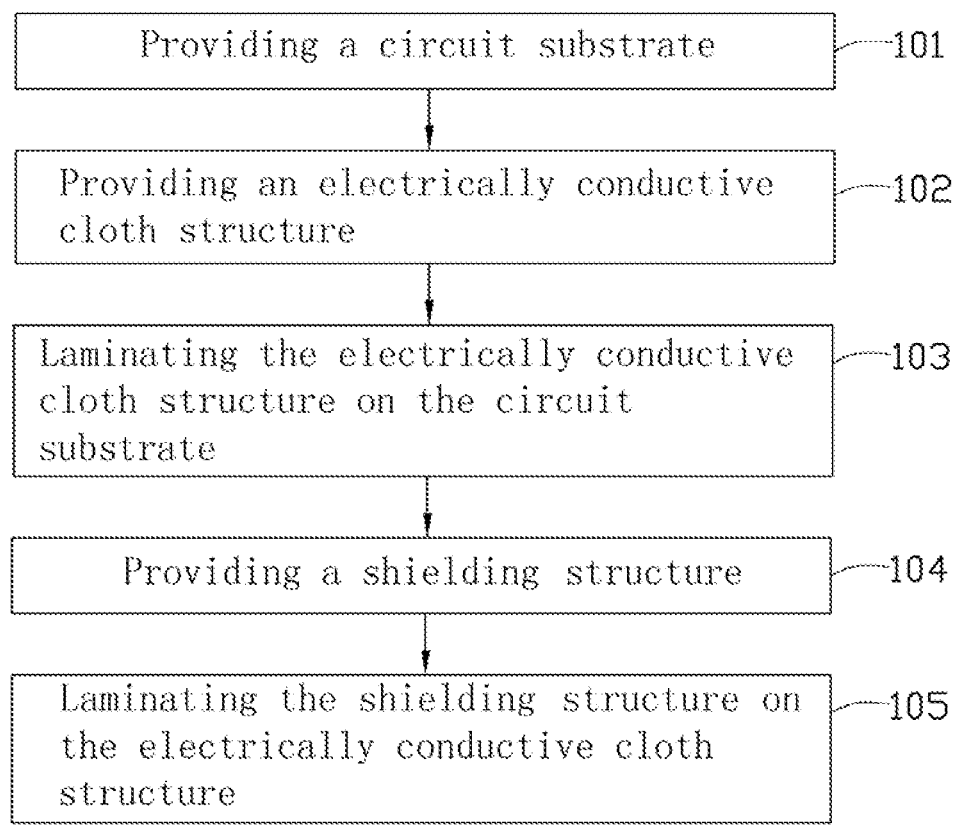
FIG. 1 is a flow chart showing a method for manufacturing a PCB having a shielding structure in accordance with a first embodiment.

Referring to FIG. 1, a method for manufacturing a PCB having a shielding structure includes the following steps.

Figure 2:
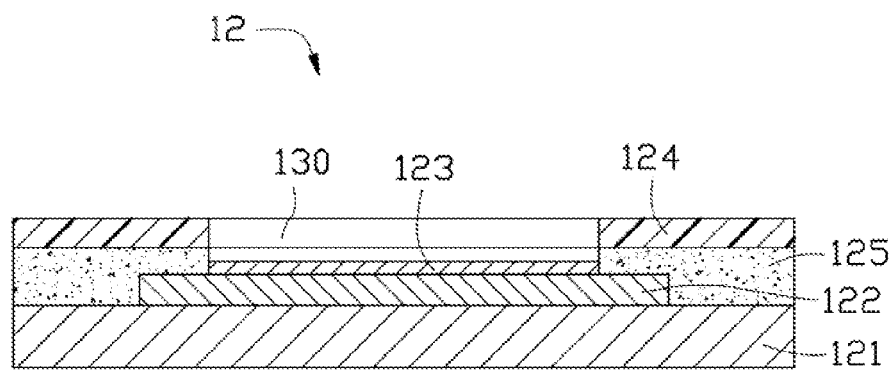
FIG. 2 is a perspective view of a circuit substrate in accordance with a first embodiment.

Referring to FIGS. 1 and 2, in step 101, a circuit substrate 12 is provided.

The circuit substrate 12 comprises a base layer 121, a grounded circuit layer 122, a connecting pad 123, a protective layer 124, and an adhesive layer 125. The grounded circuit layer 122 is formed on a surface of the base layer 121. The connecting pad 123 is electrically connected to the grounded circuit layer 122. In other words, the grounded circuit layer 122 is arranged between the base layer 121 and the connecting pad 123. A cross-section area of the connecting pad 123 is much smaller than that of the grounded circuit layer 122.

The adhesive layer 125 is used to attach the protective layer 124 to a surface of the base layer 121. The adhesive layer 125 covers part of the grounded circuit layer 122 and the base layer 121 exposed from the grounded circuit layer 122. The protective layer 124 is formed on a surface of the adhesive layer 125 and covers the adhesive layer 125. The protective layer 124 and the adhesive layer 125 define an opening 130 to expose the connecting pad 123.

Figure 3:
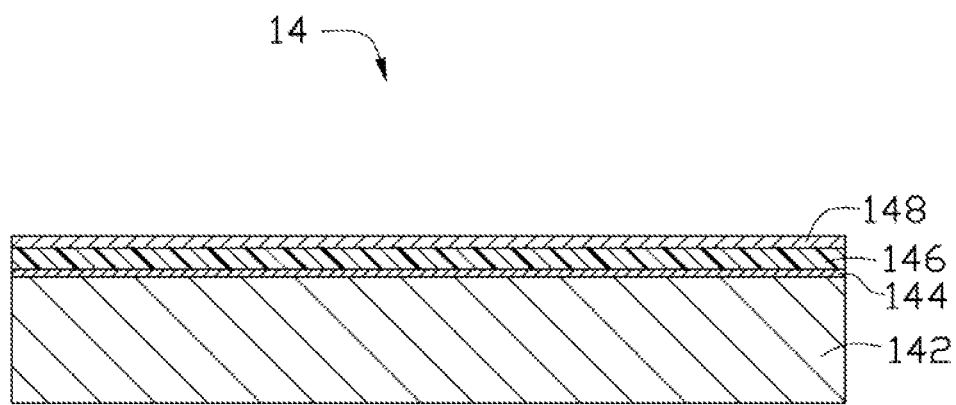
FIG. 3 is a perspective view of an electrically conductive cloth structure in accordance with a first embodiment.

Referring to FIGS. 1 and 3, in step 102, an electrically conductive cloth structure 14 is provided.

The cloth structure 14 comprises an anisotropic conductive adhesive 142, a metallic deposition layer 144, an insulating layer 146, and a release film 148. The metallic deposition layer 144 is arranged between the adhesive 142 and the insulating layer 146. The release film 148 is positioned on a surface of the insulating layer 146, and is used to protect the metallic deposition layer 144 and the insulating layer 146 in a laminating process. In one embodiment, a thickness of the cloth structure 14 is from 0.5 micrometers ($\mu m$) to 100 $\mu m$.

Figure 4:
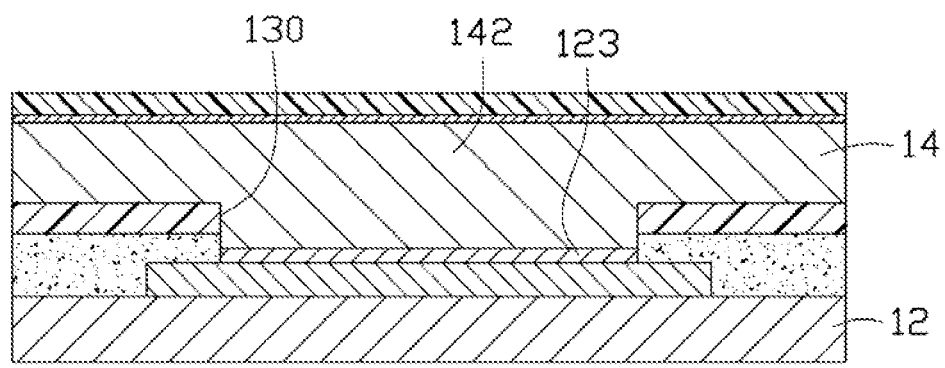
FIG. 4 is similar to FIG. 2, but showing the electrically conductive cloth structure from FIG. 3 laminated on a surface of the circuit substrate in accordance with a first embodiment.

Referring to FIGS. 1 and 4, in step 103, the cloth structure 14 is laminated onto the circuit substrate 12.

The cloth structure 14 is laminated onto the circuit substrate 12 by a laminating device (not shown in FIG. 4). The adhesive 142 is pressed and filled in the opening 130, and the adhesive 142 contacts a surface of the connecting pad 123. After laminating the cloth structure 14, the release film 148 is removed.

Figure 5:
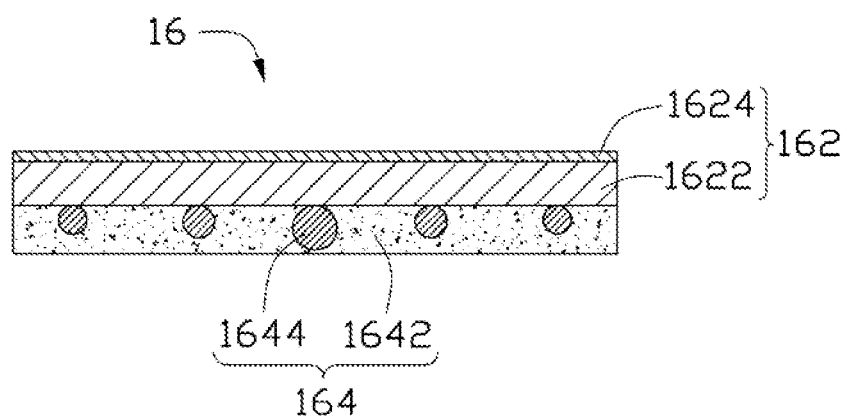
FIG. 5 is a perspective view of a shielding structure in accordance with a first embodiment.

Referring to FIGS. 1 and 5, in step 104, a shielding structure 16 is provided.

The shielding structure 16 comprises a shielding metal layer 162 and an electrically connecting layer 164 formed on a surface of the metal layer 162. The connecting layer 164 comprises an adhesive matrix 1642 and a number of electrically conductive particles 1644 distributed in the matrix 1642. A diameter of each of the particles 1644 is larger than a thickness of the insulating layer 146 of the cloth structure 14. The material of the shielding metal layer 162 can be selected from the group consisting of Au, Ag, Cu, Al, Ni, and any combination thereof. The particles 1644 can be selected from the group consisting of Au particles, Ni particles, Ni particles coated with Au, plastic particles coated with Au, plastic particles coated with Ni, and any combination thereof.

In one embodiment, the shielding metal layer 162 includes a copper layer 1622 and a gold layer 1624. The copper layer 1622 is arranged between the adhesive matrix 1642 and the gold layer 1624. The thickness of the shielding structure 16 is from 0.5 µm to 50 µm. The diameter of each of the particles 1644 is from 0.1 µm to 40 µm.

Figure 6:
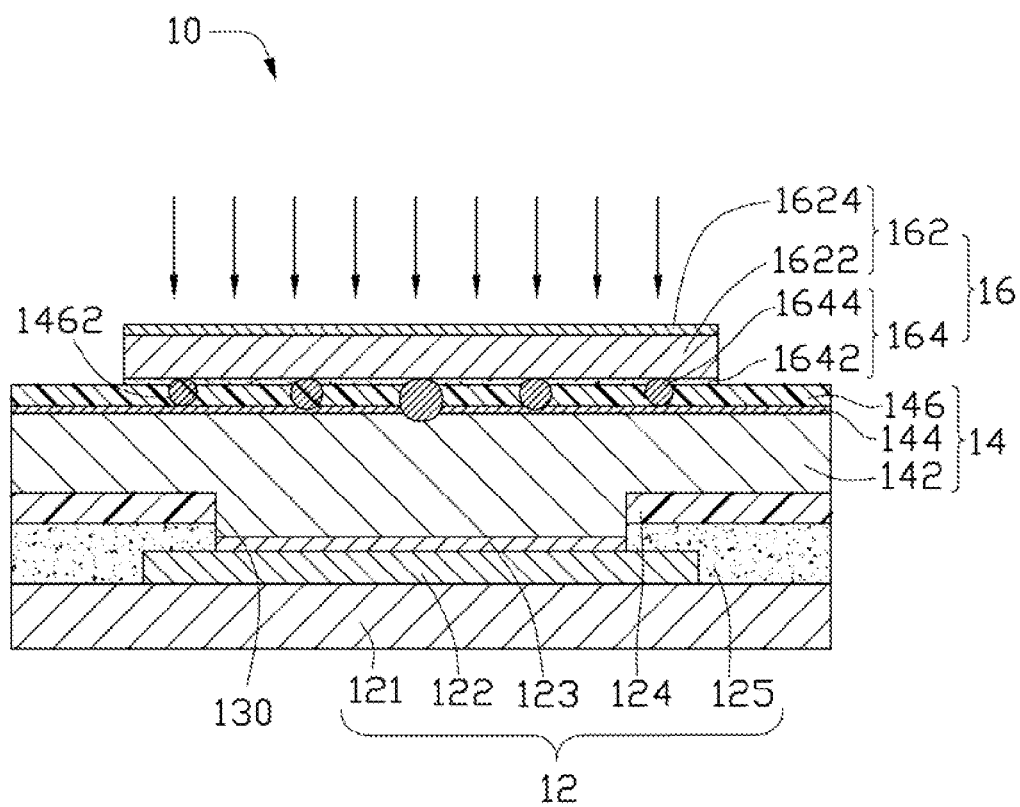
FIG. 6 is similar to FIG. 4, but showing the shielding structure from FIG. 5 laminated on the electrically conductive cloth structure in accordance with a first embodiment.

Referring to FIGS. 1 and 6, the shielding structure 16 is laminated on a surface of the cloth structure 14.

A thermal laminating process is applied to the shielding structure 16 and the cloth structure 14 by a laminating device (not shown in FIG. 6). The adhesive matrix 1642 of the shielding structure 16 is adhered to the insulating layer 146. The particles 1644 are laminated to be dispersed throughout the insulating layer 164 to electrically connect the metallic deposition layer 144 to the shielding metal layer 162. In the laminating process, the laminating time is from about 100 seconds to 200 seconds to ensure that the particles 1644 are uniformly dispersed. After the laminating process, the particles 1644 are in electrical contact with the metallic deposition layer 144 and the shielding metal layer 162. Moreover, some particles 1644 penetrate the metal deposition layer 144. Therefore, the shielding metal layer 162 can electrically connect the metal deposition layer 144 to the adhesive 142 to lead residual static electricity existing in the adhesive 142 out.

As shown in FIG. 6, a PCB 10 is formed by the above method in the first embodiment. The PCB 10 comprises the circuit substrate 12, the electrically conductive cloth structure 14, and the shielding structure 16.

Figure 7:
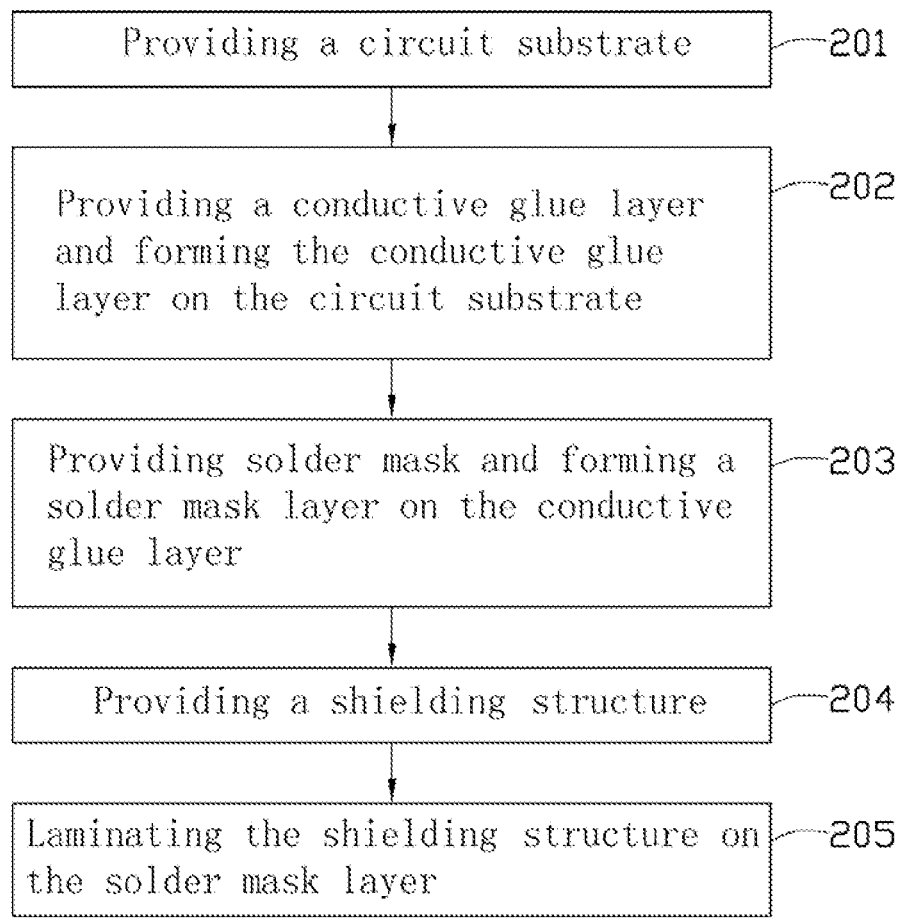
FIG. 7 is a flow chart showing a method for manufacturing a PCB having a shielding structure according to a second embodiment.

Referring to FIG. 7, a method for manufacturing a PCB having a shielding structure in another embodiment comprises the steps below.

Figure 8:
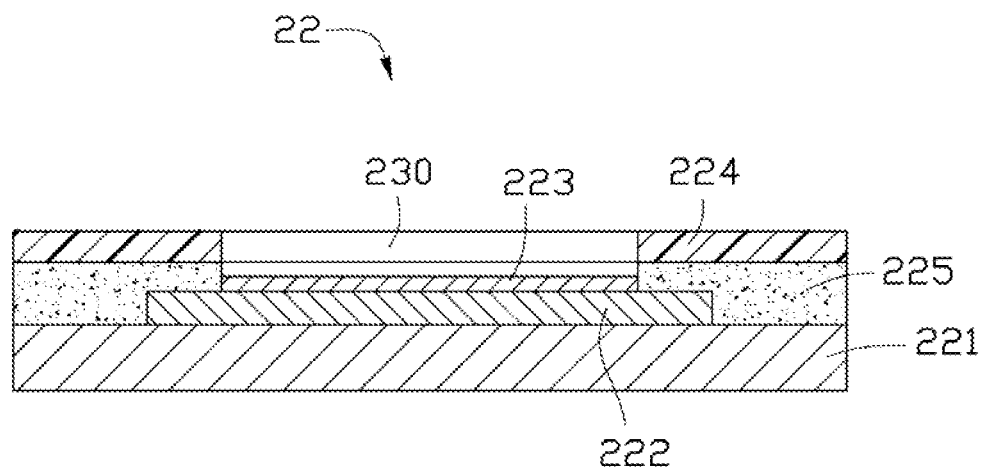
FIG. 8 is a perspective view of a circuit substrate in accordance with the second embodiment.

Referring to FIGS. 7 and 8, in step 201, a circuit substrate 22 is provided.

The circuit substrate 22 comprises a base layer 221, a grounded circuit layer 222, a connecting pad 223, a protective layer 224, and an adhesive layer 225. The grounded circuit layer 222 is formed on a surface of the base layer 221. The connecting pad 223 is electrically connected to the grounded circuit layer 222. In other words, the grounded circuit layer 222 is arranged between the base layer 221 and the connecting pad 223. A cross-section area of the connecting pad 223 is much smaller than that of the grounded circuit layer 222.

The adhesive layer 225 is used to attach the protective layer 224 to a surface of the base layer 221. The adhesive layer 225 covers part of the grounded circuit layer 222 and the base layer 221 exposed from the grounded circuit layer 222. The protective layer 224 is formed on a surface of the adhesive layer 225 and covers the adhesive layer 225. The protective layer 224 and the adhesive layer 225 define an opening 230 to expose the connecting pad 223.

Figure 9:
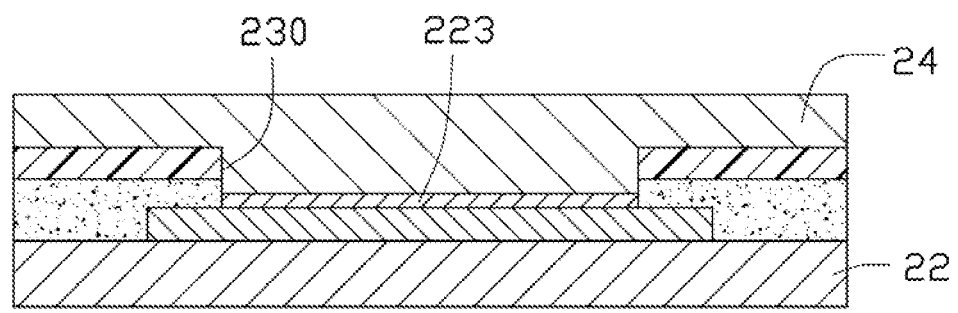
FIG. 9 is similar to FIG. 8, but showing electrically conductive adhesive applied on a surface of the circuit substrate in accordance with the second embodiment.

Referring to FIGS. 7 and 9, in step 202, a conductive adhesive layer 24 is formed onto the circuit substrate 22.

The conductive adhesive layer 24 can be formed on the circuit substrate 22 by printing or coating. The conductive adhesive layer 24 is filled in the opening 230 and electrically connected to the connecting pad 223. In one embodiment, the thickness of the conductive adhesive layer 24 is from 0.5 µm to 100 µm. The conductive adhesive layer 24 is formed with silver glue or copper glue. The silver glue or copper glue is formed on the circuit substrate 22 by screen printing.

Figure 10:
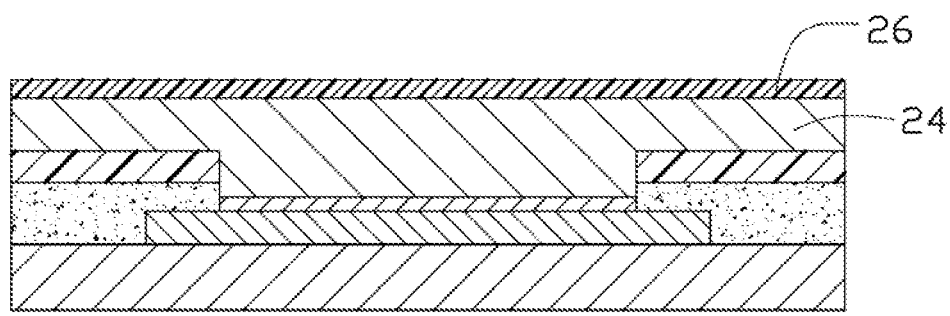
FIG. 10 is similar to FIG. 9, but showing a solder mask formed on a surface of the electrically conductive adhesive in accordance with the second embodiment.

Referring to FIGS. 7 and 10, a solder mask layer 26 is formed on a surface of the conductive adhesive layer 24.

The solder mask layer 26 can be formed on the surface of the conductive adhesive layer 24 by printing or coating. In one embodiment, a thickness of the solder mask layer 26 is from 0.5 µm to 100 µm.

Figure 11:
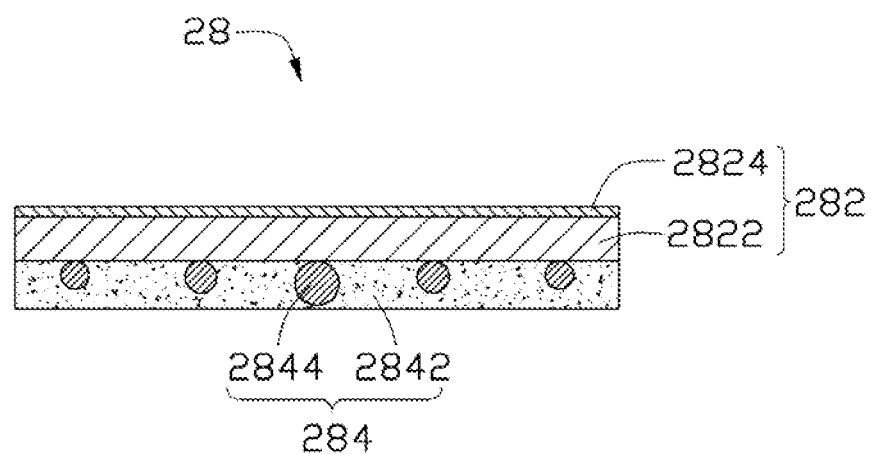
FIG. 11 is a perspective view of a shielding structure in accordance with the second embodiment.

Referring to FIGS. 7 and 11, a shielding structure 28 is provided.

The shielding structure 28 comprises a shielding metal layer 282 and an electrical connecting layer 284 formed on a surface of the shielding metal layer 282. The connecting layer 284 comprises an adhesive matrix 2842 and a number of electrically conductive particles 2844 distributed in the matrix 2842. A diameter of each of the particles 2844 is larger than a thickness of the solder mask layer 26. The material of the shielding metal layer 282 can be selected from the group consisting of Au, Ag, Cu, Al, Ni, and any combination thereof. The particles 2844 can be selected from the group consisting of Au particles, Ni particles, Ni particles coated with Au, plastic particles coated with Au, plastic particles coated with Ni, and any combination thereof.

In one embodiment, the shielding metal layer 282 includes a copper layer 2822 and a gold layer 2824. The copper layer 2822 is arranged between the adhesive matrix 2842 and the gold layer 2824. The thickness of the shielding structure 28 is from 0.5 µm to 50 µm. The diameter of each of the particles 2844 is from 0.1 µm to 40 µm.

Figure 12:
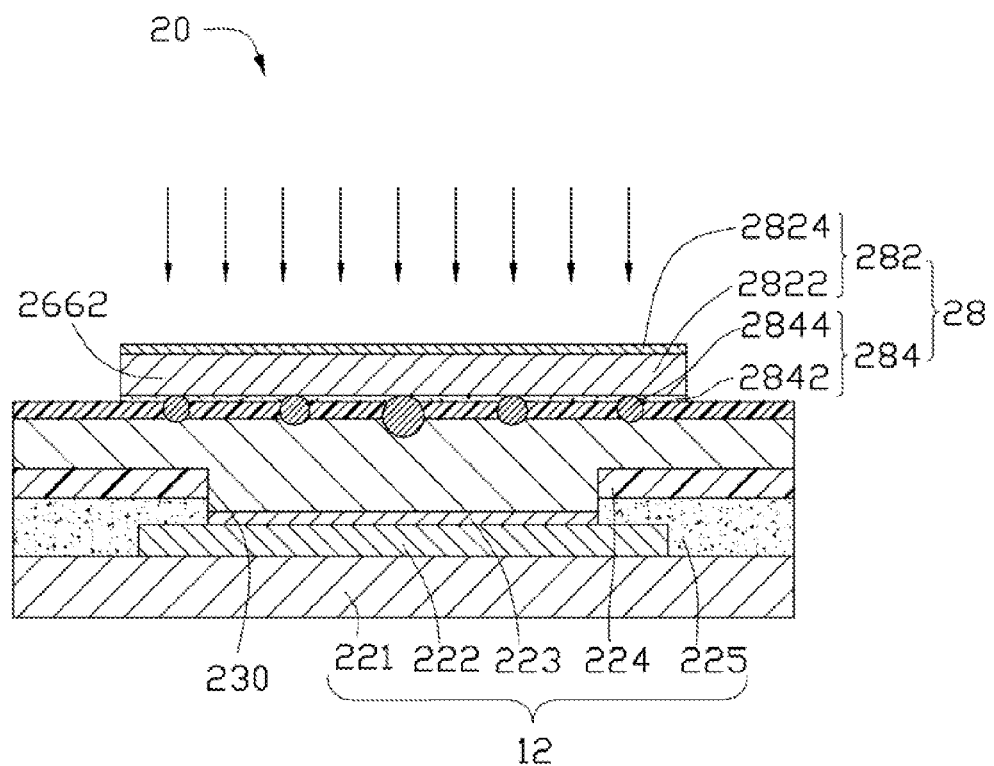
FIG. 12 is similar to FIG. 10, but showing the shielding structure from FIG. 11 laminated on the solder mask in accordance with the second embodiment.

Referring to FIGS. 7 and 12, in step 205, the shielding structure 28 is laminated onto the solder mask layer 26.

A thermal laminating process is applied to the solder mask layer 26 and the shielding structure 28 by a laminating device (not shown in FIG. 12). The adhesive matrix 2842 of the shielding structure 28 is adhered to the solder mask layer 26. The particles 2844 are laminated to be dispersed throughout the solder mask layer 26 to electrically connect the conductive adhesive layer 24 to the shielding metal layer 282. In the laminating process, the laminating time is from about 100 seconds to 200 seconds to ensure that the particles 2844 are uniformly distributed throughout solder mask layer 26. After the laminating process, the particles 2844 are in electrical contact with the conductive adhesive layer 24 and the shielding metal layer 282. Therefore, the shielding metal layer 282 can electrically connect to the conductive adhesive layer 24 to lead residual static electricity existing in the conductive adhesive layer 24 out.

As shown in FIG. 12, a PCB 20 is formed by the above method in another embodiment. The PCB 20 comprises the circuit substrate 22, the conductive adhesive layer 24, the solder mask layer 26, and the shielding structure 28.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

The invention claimed is:
1. A printed circuit board, comprising:
   a circuit substrate comprising a base layer, a grounded circuit layer formed on the base layer, and a connecting pad formed on the grounded circuit layer;
   a conductive adhesive layer formed onto the circuit substrate and electrically connected with the connecting pad;

a solder mask layer formed on the conductive adhesive layer; and a shielding structure comprising a shielding metal layer, and an electrically connecting layer formed on the shielding metal layer, the electrically connecting layer comprising an adhesive matrix and a plurality of electrically conductive particles doped in the adhesive matrix, a size of each of the electrically conductive particles being larger than a thickness of the solder mask layer, the electrically connecting layer being laminated on the solder mask layer by a thermal laminating process, thereby, the particles extending through the solder mask layer and being in electrical contact with the conductive adhesive layer and the shielding metal layer.

2. The printed circuit board of claim 1, wherein a material of the shielding metal layer is selected from the group consisting of Au, Ag, Cu, Al, Ni, and any combination thereof.

3. The printed circuit board of claim 1, wherein a thickness of the shielding structure is in the range from 0.5 μm to 50 μm, and the size of each of the electrically conductive particles is in the range from 0.1 μm to 40 μm.

4. The printed circuit board of claim 1, wherein the shielding metal layer comprises a copper layer and a gold layer, and the copper layer is arranged between the adhesive matrix and the gold layer.

5. The printed circuit board of claim 4, wherein a thickness of the copper layer is larger than that of the gold layer.

* * * * *